US008157415B2

(12) United States Patent
Tseng et al.

(10) Patent No.: US 8,157,415 B2
(45) Date of Patent: Apr. 17, 2012

(54) LIGHT EMITTING DIODE LIGHTING MODULE AND METHOD FOR MAKING THE SAME

(75) Inventors: Ching-Lin Tseng, Taipei Hsien (TW); Yu-Shen Chen, Taipei Hsien (TW); Ming-Li Chang, Taipei Hsien (TW)

(73) Assignee: Bright LED Electronics Corp., Taipei Hsien (TW)

( * ) Notice: Subject to any disclaimer, the term of this patent is extended or adjusted under 35 U.S.C. 154(b) by 0 days.

(21) Appl. No.: 12/401,266

(22) Filed: Mar. 10, 2009

(65) Prior Publication Data

US 2009/0231849 A1 Sep. 17, 2009

(30) Foreign Application Priority Data

Mar. 12, 2008 (TW) ................................ 97108677 A

(51) Int. Cl.

| | |
|---|---|
| ***F21V 21/00*** | (2006.01) |
| ***H05K 7/18*** | (2006.01) |
| ***H01L 23/495*** | (2006.01) |
| ***H01R 43/00*** | (2006.01) |

(52) U.S. Cl. ..................... 362/249.02; 174/529; 29/827; 361/813

(58) Field of Classification Search .................. 362/264, 362/294, 545, 547, 97.3, 236, 238, 249.01, 362/249.02, 249.04, 249.05, 249.06, 646, 362/659, 800; 361/720, 723, 813; 438/25, 438/27, 28, 108, 113, 119, 122, 123, 124; 257/88, 99, E31.108, E33.057, E33.062, 257/E33.066, 666, 668; 29/827, 830, 832, 29/842, 854, 876

See application file for complete search history.

(56) References Cited

U.S. PATENT DOCUMENTS

| | | | | |
|---|---|---|---|---|
| 5,049,527 | A * | 9/1991 | Merrick et al. | 438/25 |
| 6,480,389 | B1 | 11/2002 | Shie et al. | |
| 6,498,355 | B1 | 12/2002 | Harrah et al. | |
| 6,999,318 | B2 * | 2/2006 | Newby | 361/719 |
| 7,201,511 | B2 * | 4/2007 | Moriyama et al. | 362/646 |
| 7,560,748 | B2 | 7/2009 | Ishizaka et al. | |
| 7,626,208 | B2 * | 12/2009 | Yang et al. | 257/88 |
| 7,629,188 | B2 * | 12/2009 | Chen et al. | 438/28 |
| 7,855,395 | B2 * | 12/2010 | Lee et al. | 257/99 |
| 7,872,278 | B2 | 1/2011 | Stoyan | |
| 2004/0089898 | A1 | 5/2004 | Ruhnau et al. | |
| 2006/0141851 | A1 * | 6/2006 | Matsui et al. | 439/490 |
| 2008/0019103 | A1 * | 1/2008 | Kim | 361/720 |
| 2008/0101067 | A1 * | 5/2008 | Cariboni | 362/245 |
| 2008/0130289 | A1 * | 6/2008 | Takemoto et al. | 362/294 |
| 2009/0091934 | A1 * | 4/2009 | Lin | 362/294 |
| 2009/0097249 | A1 * | 4/2009 | Lee et al. | 362/249.02 |
| 2009/0231849 | A1 | 9/2009 | Tseng et al. | |
| 2010/0181890 | A1 | 7/2010 | Tseng et al. | |

OTHER PUBLICATIONS

Information about Related Patents and Patent Applications, see section 6 of the accompanying Information Disclosure Statement Letter, which concerns Related Patents and Patent Applications.

* cited by examiner

*Primary Examiner* — Hargobind S Sawhney

(74) *Attorney, Agent, or Firm* — Fox Rothschild, LLP; Robert J. Sacco

(57) ABSTRACT

A method for making a light emitting diode lighting module includes steps of: (a) packaging a plurality of light emitting diode dies respectively on a plurality of die-mounting parts of a metal lead frame to form a plurality of light emitting diodes, respectively; and (b) cutting off supporting parts of the lead frame so as to form a connecting structure through which the light emitting diodes are connected to each other in one of serial, parallel, and serial-and-parallel connecting manners.

6 Claims, 4 Drawing Sheets

LIGHT EMITTING DIODE LIGHTING MODULE AND METHOD FOR MAKING THE SAME

CROSS-REFERENCE TO RELATED APPLICATION

This application claims priority of Taiwanese application no. 097108677, filed on Mar. 12, 2008.

BACKGROUND OF THE INVENTION

1. Field of the Invention

The invention relates to a light emitting diode lighting module and a method for making the same, more particularly to a light emitting diode lighting module including a conductive connecting structure of a punched metal sheet, through which a plurality of light emitting diodes are packaged and connected to each other in one of serial, parallel, and serial-and-parallel connecting manners.

2. Description of the Related Art

Referring to FIG. 1, a conventional light emitting diode lighting module (hereinafter referred as LED lighting module) 1 is shown to include a printed circuit board 12 (or a ceramic board) with conductive traces 121, a heat sink 13 connected to the printed circuit board 12, and a plurality of light emitting diode packages 10 (hereinafter referred as LED package) soldered to and arranged on the printed circuit board 12 so as to be connected to each other in a serial or parallel connecting manner through the conductive traces 121. The LED packages 10 can be formed using any well-known method. For example, the LED packages 10 can be formed by attaching light emitting diode dies (not shown) to a lead frame (not shown) to form an assembly (not shown), followed by enclosing each of the light emitting diode dies using an encapsulant or lens (not shown).

However, the steps of arranging and soldering the LED packages 10 onto the printed circuit board 12 result in a decrease in the productivity of the LED lighting module 1. Besides, the presence of the printed circuit board 12 between the LED packages 10 and the heat sink 13 will reduce the thermal dissipation of the LED packages 10 when the LED lighting module 1 is turned on, and thus, will shorten the service life of the LED packages 10.

SUMMARY OF THE INVENTION

Therefore, an object of the present invention is to provide a method for making a light emitting diode (LED) lighting module that can overcome the aforesaid drawbacks associated with the prior art.

Another object of the present invention is to provide a light emitting diode (LED) lighting module that dispenses with the need for a printed circuit board.

According to one aspect of the present invention, there is provided a method for making a light emitting diode (LED) lighting module, comprising: (a) packaging a plurality of light emitting diode dies respectively on a plurality of die-mounting parts of a metal lead frame to form a plurality of light emitting diodes, respectively; and (b) cutting off supporting parts of the lead frame so as to form a connecting structure through which the light emitting diodes are connected to each other in one of serial, parallel, and serial-and-parallel connecting manners.

According to another aspect of the present invention, there is provided a light emitting diode lighting module comprising: a punched metal sheet having a conductive connecting structure; and a plurality of light emitting diode, each of which includes a light emitting diode die packaged on the punched metal sheet.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
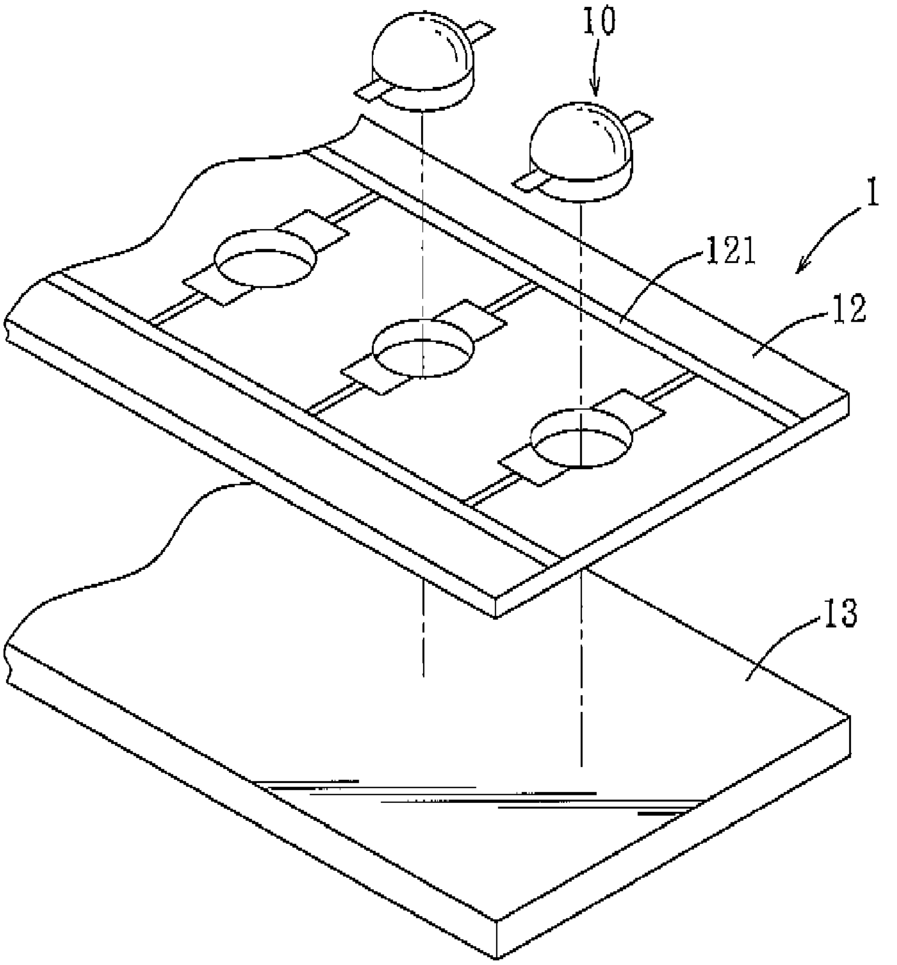
FIG. 1 PRIOR ART
FIG. 1 is a fragmentary exploded perspective view of a conventional LED lighting module.
Figure 2:
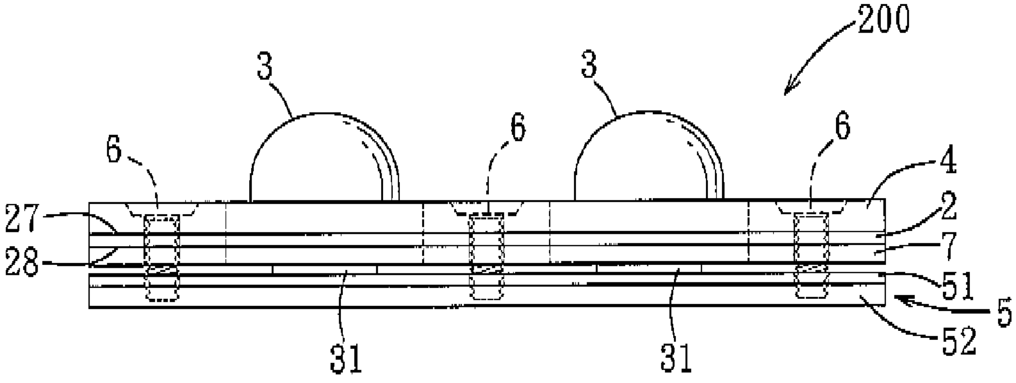
FIG. 2 is a side view of the first preferred embodiment of a light emitting diode (LED) lighting module according to the present invention.
Figure 3:
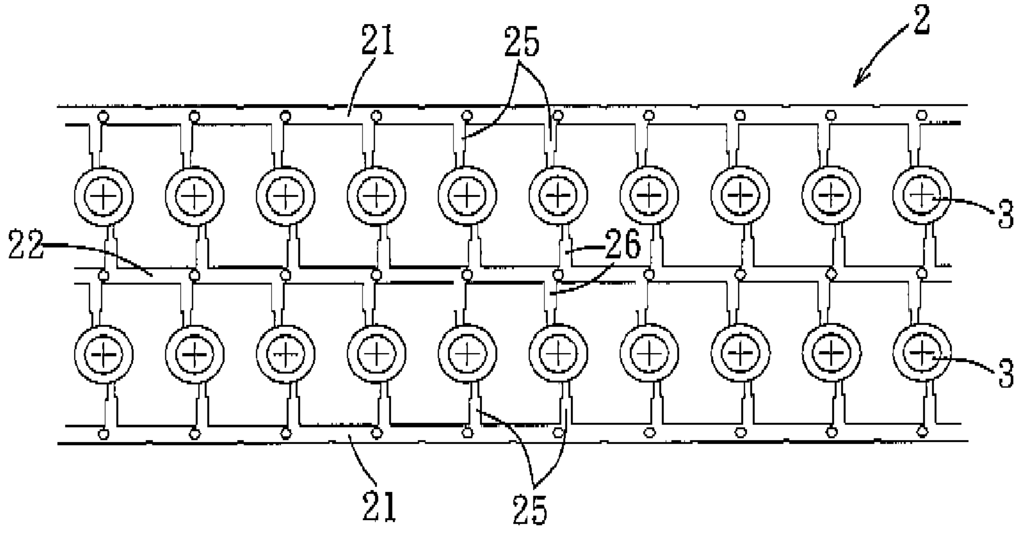
FIG. 3 is a fragmentary schematic top view of the first preferred embodiment which shows a connecting structure of a lead frame and a plurality of light emitting diodes packaged on the lead frame, illustrating one of possible connecting modes of the light emitting diodes.

Referring to FIGS. 2 and 3, the LED lighting module 200 of the first preferred embodiment of this invention is shown to include: a conductive connecting structure 2 of a punched metal sheet, and a plurality of light emitting diodes (hereinafter referred as LEDs) 3. The connecting structure 2 is formed from a metal lead frame used for packaging a plurality of light emitting diode dies (not shown, hereinafter referred as LED dies) thereon. The LEDs 3 are formed by packaging the LED dies therein using any well-known method, and are connected to each other in one of serial, parallel, and serial-and-parallel connecting manners through the connecting structure 2. It is noted that the printed circuit board 12 employed in the conventional LED lighting module 1 is dispensed with in the present invention, and thus, the requirement of arranging and soldering the LED packages 10 onto the printed circuit board 12 in the conventional LED lighting module 1 of FIG. 1 is eliminated in this invention.

In this preferred embodiment, the connecting structure 2 includes a plurality of die-mounting parts (not shown) for mounting LED dies thereon and for electrical connection, parallel first and second rails 21, 22, a plurality of first leads 25 connected to and disposed along the length of the first rail 21, and a plurality of second leads 26 connected to and disposed along the length of the second rail 22. Each of the LEDs 3 is electrically connected to an adjacent pair of the first and second leads 25, 26 and is packaged on a respective die mounting part.

Preferably, the LED lighting module 200 further includes a heat sink 5 connected to the bottom of the LEDs 3. The heat sink 5 includes a thermal conductive layer 51 and a mass metal part 52. Each of the LED dies of the LEDs 3 is mounted on a thermal conductive pillar 31 which can be a material made from metals, such as, Cu, Al, Fe, or their alloys. Each of the pillars 31 protrudes from the bottom of a respective LED 3. When the LED lighting module 200 is turned on, the heat generated from each of the LED dies of the LEDs 3 can be dissipated to the thermal conductive layer 51 and the mass metal part 52 of the heat sink 5 through the thermal conductive pillar 31 thereof (see FIG. 2).

Preferably, the mass metal part 52 is made from aluminum or copper. In other embodiments, the thermal conductive layer 51 can be a thermal conductive glue or a thermal conductive film, and preferably provides electrical insulation.

Figure 5:
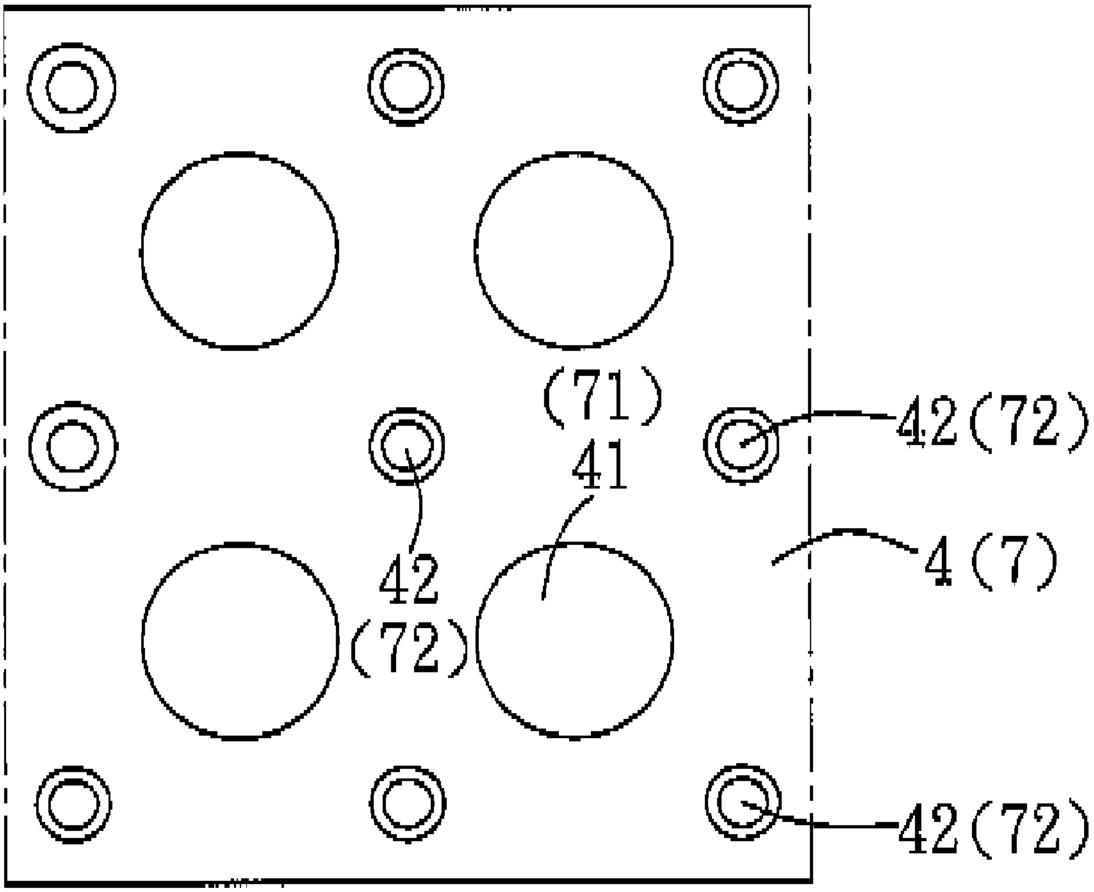
FIG. 5 is a schematic top view, illustrating the configuration of an upper (lower) electric insulator plate of the first preferred embodiment in an unlocked state.

Moreover, the connecting structure 2 further has upper and lower sides 27, 28. The LED lighting module 200 further includes an upper electric insulator plate 4 disposed on the upper side 27 of the conductive connecting structure 2 and formed with a plurality of through-holes 41 as shown in FIG. 5 for extension of the LEDs 3 therethrough (see FIGS. 2 and 5).

As shown in FIG. 2, the LED lighting module 200 further includes a lower electric insulator plate 7 attached to the lower side 28 of the connecting structure 2 between the conductive connecting structure 2 and the heat sink 5. The lower electric insulator plate 7 is formed with a plurality of through-holes 71, as shown in FIG. 5, for extension of the thermal conductive pillar 31 of each of the LEDs 3 therethrough (see FIGS. 2 and 5). The presence of the upper and lower insulator plates 4, 7 not only prevents the connecting structure 2 from short circuit, but also enhances the structural stability of the connecting structure 2. The upper and lower insulator plates 4, 7 can be made from any conventional electric insulator materials.

Figure 6:
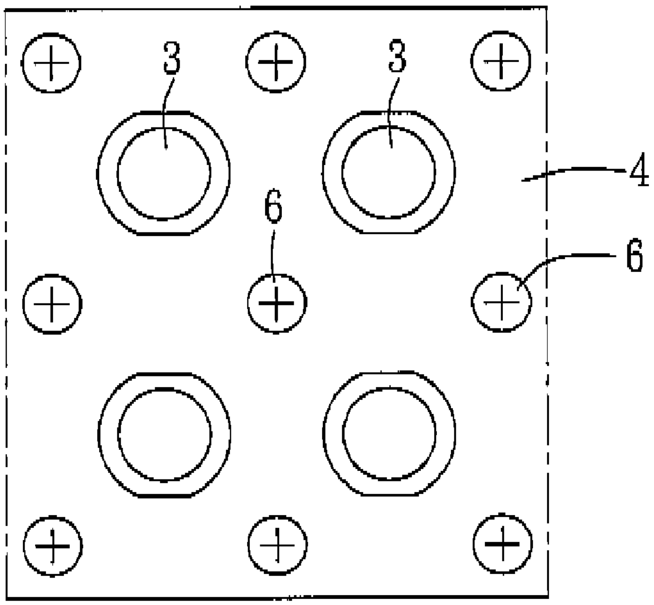
FIG. 6 is a schematic top view, illustrating the configuration of the upper (lower) electric insulator plate of the first preferred embodiment in a locked state.

Preferably, the LED lighting module 200 further includes a plurality of fasteners 6 for locking the conductive connecting structure 2, the LEDs 3, the upper and lower insulator plates 4, 7 and the heat sink 5 together. As shown in FIGS. 2, 5 and 6, the upper and lower insulator plates 4, 7 have upper and lower screw holes 42, 72, respectively, for extension of the fasteners 6 (for example, screws) therethrough. It should be noted that the upper insulator plate 4 used in the present invention is preferably slightly deformable upon tightening the fasteners 6 to press the pillars 31 of the LEDs 3 against the heat sink 5. Since the LEDs 3 in the LED lighting module 200 are fixed by the fasteners 6, not by soldering, and since the pillars 31 of the LEDs 3 are pressed against the heat sink 5, the thermal conductivity between the LEDs 3 and the heat sink 5 can be greatly improved. As such, the efficiency of the heat dissipation of the LED lighting module 200 is better than that of the prior art.

Figure 7:
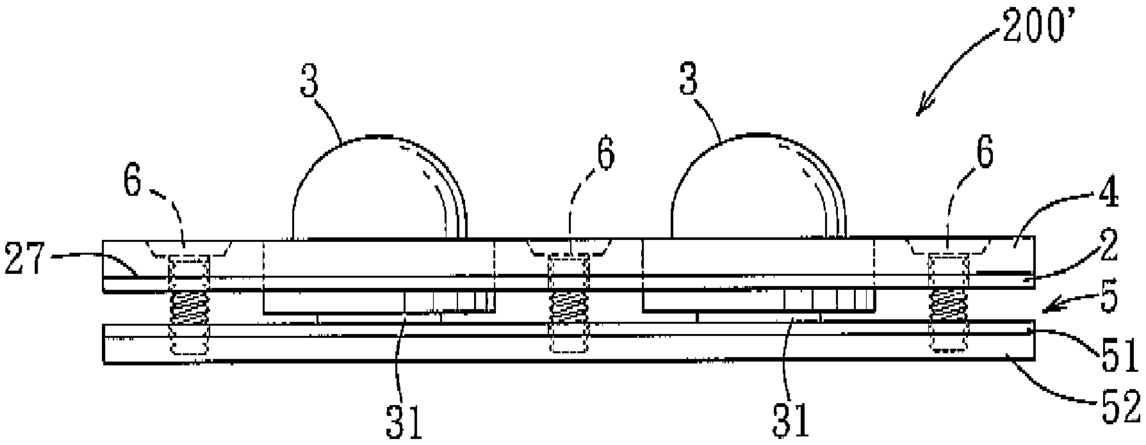
FIG. 7 is a schematic side view of the second preferred embodiment of the LED lighting module according to the present invention.

FIG. 7 illustrates the second preferred embodiment of the LED lighting module 200' according to this invention. The second preferred embodiment differs from the previous embodiment in that only the upper insulator plate 4 is attached to the upper side 27 of the connecting structure 2 and that the lower insulator plate 7 is dispensed therewith.

Figure 4:
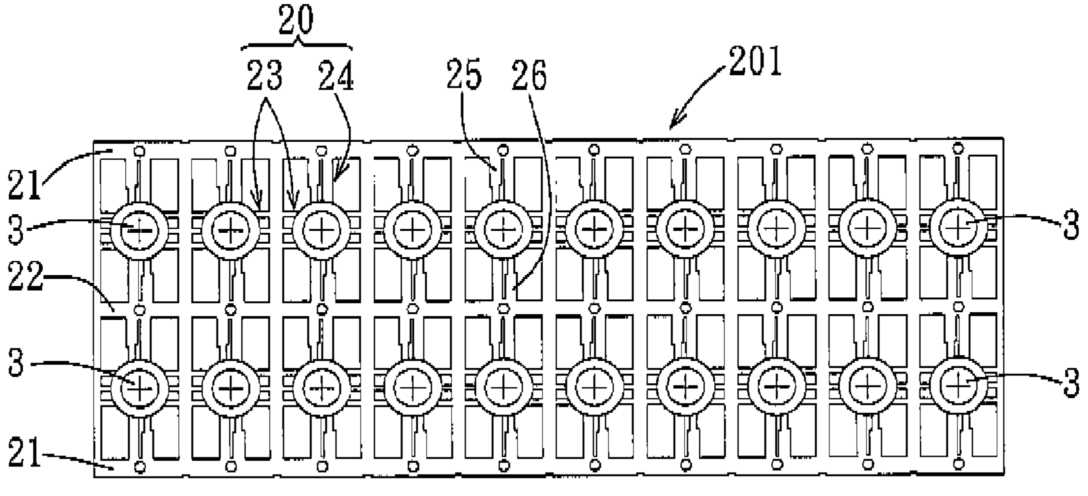
FIG. 4 is a fragmentary schematic top view of the first preferred embodiment, illustrating a state where the light emitting diodes were packaged on a lead frame which is subsequently cut for forming the connecting structure as shown in FIG. 3.

The method for making the LED lighting module 200 of the first preferred embodiment includes the following steps:

(a) packaging a plurality of LED dies (not shown) respectively on a plurality of die-mounting parts of a metal lead frame 201 to form a plurality of LEDs 3 on the lead frame 201, respectively, using any well-known LED packaging method (see FIG. 4);

(b) cutting off supporting parts 23,24 of the lead frame 201 so as to form the connecting structure 2 (see FIGS. 3 and 4 ) through which the LEDs 3 are connected to each other in one of serial, parallel, and serial-and-parallel connecting manners;

(c) covering the upper and lower sides 27, 28 of the connecting structure 2 using the upper and lower insulator plates 4, 7, respectively, after step (b) (see FIGS. 2 and 5);

(d) attaching the LEDs 3 to the heat sink 5 after step (c) (see FIG. 2); and (e) locking the connecting structure 2, the LEDs 3 the upper and lower insulator plates 4, 7, and the heat sink 5 together using the fasteners 6 (see FIG. 2).

As shown in FIGS. 3 and 4, in the first preferred embodiment, prior to the cutting operation in step (b), the conductive lead frame 201 includes the die-mounting parts, the first and second rails 21, 22, the first leads 25, the second leads 26, and the supporting parts 20 interconnecting and disposed along the lengths of the first and second rails 21, 22. Each of the supporting parts 20 has latitudinal ribs 23 and longitudinal ribs 24, and functions to support the LEDs 3 before the cutting operation.

By forming the connecting structure 2 from the lead frame 201 to interconnect the LEDs 3 in the method for making the LED lighting module 200, 200' of this invention, the need for a printed circuit board is dispensed with, and thus, the aforesaid drawbacks associated with the prior art can be eliminated. Therefore, a light emitting diode lighting module having a longer service life and higher thermal conduction efficiency can be achieved by the present invention.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method for making a light emitting diode lighting module, comprising:

(a) packaging a plurality of light emitting diode dies that are respectively formed on a plurality of die-mounting parts of a metal lead frame to form a plurality of light emitting diodes, respectively; and (b) cutting off undesirable supporting parts of the lead frame while leaving the light emitting diodes on the remaining part of the lead frame, wherein the remaining part forms a connecting structure that includes first and second rails extending on two opposite sides of the light emitting diodes, a plurality of first leads each connecting one of the light emitting diodes to the first rail, and a plurality of second leads each connecting one of the light emitting diodes to the second rail, and wherein the undesirable supporting parts include a plurality of transverse portions each of which has two ends connected directly and respectively to the first and second rails and each of which is disposed between two adjacent ones of the light emitting diodes, and a plurality of portions each of which connects one of the light emitting diodes to one of the first and second rails.

2. The method of claim 1, further comprising:

(c) covering upper and lower sides of the connecting structure using upper and lower insulator plates, respectively, after step (b), the upper insulator plate being formed with a plurality of through-holes for extension of the light emitting diodes therethrough, respectively, each of the upper and lower insulator plates covering all of the first and second rails and the first and second leads;

(d) attaching the light emitting diodes to a heat sink after step (c); and (e) locking the connecting structure, the light emitting diodes, the upper and lower insulator plates, and the heat sink together using a plurality of fasteners, each of the fasteners extending through the upper and lower insulator plates and into the heat sink to press the light emitting diodes against the heat sink.

3. The method of claim 1, wherein the undesirable supporting parts further includes a plurality of portions each of which connects one of the light emitting diodes to one of the transverse portions.

4. A method for making a light emitting diode lighting module, comprising:

(a) packaging a plurality of light emitting diode dies that are respectively formed on a plurality of die-mounting parts of a metal lead frame to form a plurality of light emitting diodes, respectively;

(b) cutting off undesirable supporting parts of the metal lead frame from the remaining part of the metal lead frame while leaving the light emitting diodes on the remaining part of the metal lead frame, wherein the remaining part forms a connecting structure that includes first and second rails extending on two opposite sides of the light emitting diodes, a plurality of first leads each connecting one of the light emitting diodes to the first rail, and a plurality of second leads each connecting one of the light emitting diodes to the second rail, and wherein the undesirable supporting parts include a plurality of transverse portions each of which has two ends connected directly and respectively to the first and second rails and each of which is disposed between two adjacent ones of the light emitting diodes, a plurality of portions each of which connects one of the light emitting diodes to one of the first and second rails, and a plurality of portions each of which connects one of the light emitting diodes to one of the transverse portions; and (c) covering an upper side of the remaining part of the metal lead frame, which has been cut, with an upper insulator plate that has a plurality of through-holes for extension of the light emitting diodes therethrough, respectively, the upper insulator plate covering all of the first and second rails and the first and second leads.

5. The method of claim 4, further comprising:

attaching the light emitting diodes to a heat sink; and locking the remaining part of the metal lead frame, the light emitting diodes, the upper insulator plate, and the heat sink together using a plurality of fasteners, each of the fasteners extending through the upper insulator plate and into the heat sink to press the light emitting diodes against the heat sink.

6. A method for making a light emitting diode lighting module, comprising:

(a) packaging a plurality of light emitting diode dies that are respectively formed on a plurality of die-mounting parts of a metal lead frame to form a plurality of light emitting diodes, respectively; and (b) cutting off undesirable supporting parts of the lead frame while leaving the light emitting diodes on the remaining part of the lead frame, wherein the remaining part forms a connecting structure that includes first and second rails extending on two opposite sides of the light emitting diodes, a plurality of first leads each connecting one of the light emitting diodes to the first rail, and a plurality of second leads each connecting one of the light emitting diodes to the second rail, and wherein the undesirable supporting parts include a plurality of transverse portions each of which has two ends connected directly and respectively to the first and second rails and each of which is disposed between two adjacent ones of the light emitting diodes, and a plurality of portions each of which connects one of the light emitting diodes to one of the transverse portions.

* * * * *